United States Patent [19]

Hoffmann et al.

[11] 4,206,471

[45] Jun. 3, 1980

[54] SEMICONDUCTOR STORAGE ELEMENT AND A PROCESS FOR THE PRODUCTION THEREOF

[75] Inventors: Kurt Hoffmann, Taufkirchen; Reiner Sigusch, Munich, both of Fed. Rep. of Germany

[73] Assignee: Siemens Aktiengesellschaft, Berlin & Munich, Fed. Rep. of Germany

[21] Appl. No.: 943,065

[22] Filed: Sep. 18, 1978

[30] Foreign Application Priority Data

Sep. 28, 1977 [DE] Fed. Rep. of Germany ....... 2743619

[51] Int. Cl.² .............................................. H01L 27/10
[52] U.S. Cl. ........................................ 357/45; 357/41; 307/238; 29/571
[58] Field of Search ............................. 357/41, 45, 23; 307/238; 29/571

[56] References Cited

U.S. PATENT DOCUMENTS

| | | | |
|---|---|---|---|
| 3,997,799 | 12/1976 | Baker | 307/238 |
| 4,139,786 | 2/1979 | Raymond et al. | 307/238 |
| 4,150,389 | 4/1979 | Roessler | 357/23 |

OTHER PUBLICATIONS

Engeler et al, *IEEE Journal of Solid State Circuits*, vol. SC-7, No. 5, Oct. 1972.

*Primary Examiner*—Martin H. Edlow
*Attorney, Agent, or Firm*—Hill, Van Santen, Steadman, Chiara & Simpson

[57] ABSTRACT

A semiconductor storage element is disclosed having a storage capacitor whose storage electrode is arranged above a doped semiconductor layer. The storage electrode is formed of a portion of a strip-like reference potential line which is separated from the semiconductor layer by a thin insulating layer. A transfer gate is also provided adjacent to the storage electrode which is formed from a portion of a strip-like word line likewise separated from the semiconductor layer by a thinner insulating layer. An oppositely doped zone is arranged at a surface of the semiconductor layer and serves as a bit line. The word line and the reference potential line run parallel to one another and are arranged directly adjacent to one another. When a potential is connected to the transfer gate, the bit line doped zone may be selectively conductively connected to the storage zone. The reference potential line for one group of the storage elements can be also used as a word line for another group of the storage elements.

11 Claims, 6 Drawing Figures

SEMICONDUCTOR STORAGE ELEMENT AND A PROCESS FOR THE PRODUCTION THEREOF

BACKGROUND OF THE INVENTION

The invention relates to a semiconductor storage element wherein a bit line is provided in a doped oppositely conductivity zone in a semiconductor layer and a word line are provided on an insulating layer about the semiconductor layer. A transfer gate is formed of a portion of the word line.

Storage elements of this kind are known, for example, from the "IEEE Journal of Solid-State Circuits", Vol. SC-7, pages 330–335, Oct. 1972, in which the transfer gate can also be referred to as a selector gate as it serves to select the storage capacitor to which it is assigned for the purpose of write-in or read-out of a digital item of information from among the total number of storage capacitors connected to a bit line.

SUMMARY OF THE INVENTION

It is an object of the invention to provide a semiconductor storage element which exhibits an area saving drive and can be integrated into a matrix arrangement in area-saving fashion.

This is achieved in accordance with the invention by a design of the semiconductor storage element wherein the word line and the reference potential line run parallel to one another and approximately at right angles to the bit line. The reference potential line and word line are arranged directly adjacent to one another.

The advantage which can be achieved by the invention consists in particular in that those drive lines which, when such storage elements are combined to form a matrix, are each commonly assigned to one and the same group of storage elements, namely the word line and the reference potential line, run in parallel with one another in an optimally area-saving arrangement, and in particular overlap one another at the edge. This arrangement is then further employed in a matrix constructed from the storage elements and wherein by means of a special drive, namely by a selective use of each of these lines as a word line or as a reference potential line, one such line is saved in virtually each of assigned storage element groups. Thus, the parallel offset, measured in the direction of the bit line, of two adjacent storage capacitors corresponds to the distance, measured from line center to line center, between the drive lines which overlap at the edge. Here the bit line is optimally shortened for a given number of storage capacitors which are to be selectively connected therewith, so that the bit line capacitance is reduced and forms a favorable relationship with the capacitances of the individual storage capacitors.

An advantageous process for the production of a semiconductor storage element in accordance with this invention proceeds by coating a doped semiconductor layer with an insulating layer. Openings are provided in the insulating layer through which a surface-side semiconductor zone of doping conductivity opposite to the semiconductor layer is formed in the semiconductor layer by doping. A closed insulating layer is then again provided on the semiconductor layer and an opening is formed in the insulating layer which corresponds to a region of the transfer gate and the capacitor storage electrode. The semiconductor layer is coated within this opening with a thin insulating layer and then a first electrically conductive coating is applied to an entire surface of the insulating layer and thin insulating layer. By masked etching steps, portions of the conductive coating are removed until only parts which form the storage electrode and the reference potential line (or the transfer gate and the word line) remain. Another insulating layer is applied which covers the remaining portions of the first conductive coating and then a second electrically conductive coating is applied to the entire surface of another insulating layer. Portions of the second coating are removed by masked etching steps until portions remain which form the transer gate and the word line (the storage electrode and the reference potential line).

DESCRIPTION OF THE PREFERRED EMBODIMENTS

Figure 1:
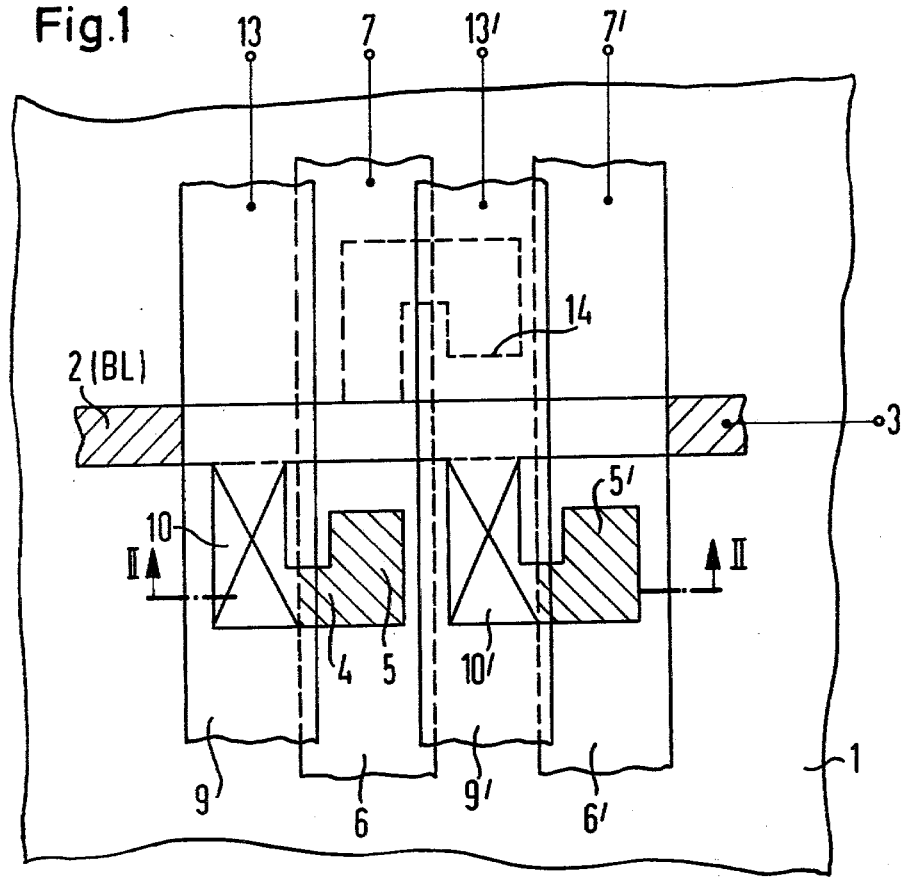
FIG. 1 is a plan view of a semiconductor storage element designed in accordance with the invention.
Figure 2:
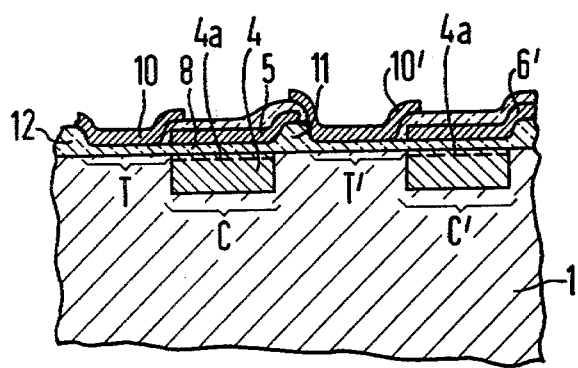
FIG. 2 is a cross-section along the line II—II of FIG. 1.

FIGS. 1, 2 and 3 represent a p-doped semiconductor layer 1, in particular a silicon layer, which is provided with a n+ doped, strip-like, surface-side zone 2 which is partially shaded in FIG. 1 and which represents a bit line BL. An end-side bit line terminal is referenced 3. A further n+ doped, surface-side zone is referenced 4 and shaded in the other direction in FIG. 1. This zone 4 forms a storage zone of the semiconductor layer 1 and, to be more precise, the first electrode of a storage capacitor C (FIG. 2). The storage electrode, arranged above the storage zone of C is referenced 5 and is formed by a part of a strip-like, conductive coating within FIG. 1 runs in the vertical direction and overall represents a reference potential line 6 having an end-side terminal 7. Between the storage electrode 5 and the surface of the semiconductor layer 1 there is arranged a thin insulating layer 8 which, for example, consists of $SiO_2$ and in this case is referred to as a gate oxide layer.

Beside the reference potential line 6, separated from the latter by a thin, insulating gap there is arranged a word line 9 which is likewise formed from a strip-like, electrically conductive coating. A part of this word line which in FIG. 1 has a fundamentally rectangular outline and is characterized by the diagonals of the rectangle, represents a transfer gate 10 which on the one hand is adjacent to the storage electrode 5 and on the other hand is separated from the surface of the semiconductor layer 1 by the already described, thin insulating layer 8. As can be seen from FIG. 1, the surface zones of the transfer gate 10 and of the storage electrode 5 run into one another and together form a U-shaped zone whose left-hand flank is extended so that it borders the region of the bit line 2. Within this U-shaped region, the surface of the semiconductor layer 1 is now covered by the thin insulating layer 8 whereas outside this region it is considerably thicker as illustrated, for example, by the insulating beads 11 and 12 which in FIG. 1 are arranged on the edge of the components 5 and 10.

Thus the area of a storage element which can be selectively connected to the bit line is defined by the position of the semiconductor zone covered with a thin insulating layer, and that part of this zone which contains the transfer gate 10 is also referred to as transfer zone T in which surface-side charge shifts are possible, whereas the storage capacitor C is formed by the storage electrode 5 and the storage zone 4 which lies opposite the latter. If the word line 9 is fed via an end-side terminal 13 with a potential of, for example, +5 V, beneath the transfer gate 10 there forms a potential which facilitates a conductive connection between the $n^+$-doped zones of the storage zone 4 and of the bit line 2. If the bit line 2 is brought to zero potential via its terminal 3 during the existence of these potential conditions, an electric charge flows via T into the storage capacitor C and is stored in the latter as binary information following the disconnection of the positive potential from the terminal 13. The stored information is read out by a new potential operation of the transfer gate 10 via the word line 9 which again leads to the formation of a potential beneath the transfer gate 10 which facilitates a conductive connection between the components 2 and 4. Now a recharging takes place between the storage capacitor C and the capacitance of the bit line 2 which produces an analyzable potential shift on the bit line 2. On account of the continuous discharge of C via the blocking layer between the zone 4 and the semiconductor layer 1, following a so-called storage time the information must be read out and written in again by means of regenerated, binary signals which correspond to the read-out signals.

On the right hand side of the previously considered storage element, FIG. 1 illustrates a further storage element which is constructed in a similar manner and comprises the transfer gate 10' and the storage electrode 5', and in FIG. 2 has been indicated by the transfer zone T' and the storage zone C'. The lines 6 and 9 and 6' and 9' overlap at the edge as can also be seen from FIG. 2, so that no potential thresholds which would obstruct a charge shift form between them within the regions of the thin insulating layer 8. However, the overlap does not need to take place in the represented manner in which the lines 9 and 9' overlap the lines 6 and 6' at the edge, but can also take place in the reverse manner in which case the lines 6 and 6' overlap the lines 9 and 9'. On the other hand, adjacent lines can also be separated from one another by a gap.

A plurality of such storage elements, which in FIG. 1 are arranged next to one another and are connected to the same bit line 2, form a row of a storage matrix, whereas a plurality of storage elements which in FIG. 1 are arranged one above another and are connected to various bit lines 2 but to the same word line 9, represent a matrix column. Operation via the word line 9 then causes all the storage elements in a column to be connected to the associated bit lines.

In accordance with a preferred further development of the invention, a storage matrix of this kind is provided with further storage elements which are designed in a similar manner and which, as represented in broken lines in FIG. 1 at 14, are arranged in the same way with respect to the lines 6 and 9' (apart from an arrangement laterally inverse to the bit line 2) as the storage elements containing the components 5 and 10 are arranged with respect to the lines 6 and 9. However, this means that in the case of these further storage elements which are combined to form further matrix columns, the lines by which they are operated, e.g. 6 and 9' are interchanged with one another, i.e. here the line 6 represents a word line and, for example, the line 9' represents a reference potential line. Therefore it is necessary, for example, to cut off the terminal 7 for driving the further storage elements e.g. 14 from the above mentioned reference potential and to use it as a word line terminal, in which case the terminal 13' must simultaneously be connected to reference potential. Since only one single matrix column is selected by a signal of the assigned word line, no disturbing influences occur between the individual matrix columns.

As a deviation from the previously described exemplary embodiment, the storage zones of the storage elements can possess inversion edge layers 4a in place of the oppositely doped, surface-side zone 4 (FIG. 2). However, this requires that the reference potential supplied at 7 and 7' be raised to a sufficiently high value which is dependent upon the thickness of the insulating layer 8. With this embodiment it is not possible to interchange the functions of the lines 6 and 9 so that no further columns of storage elements 14 can be provided.

Advantageously the lines 6, 9 and 6', 9' consist of highly doped semiconductor material, in particular polycrystalline silicon. On the other hand they can also consist of parts of a metallic coating composed, for example, of aluminum.

Figure 3A:
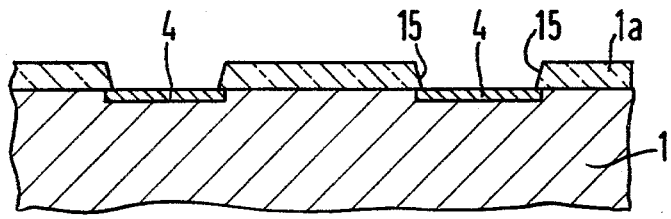
FIGS. 3(a)–(d) schematically illustrates individual steps of a production process for a storage element as illustrated in FIGS. 1 and 2.
Figure 3B:
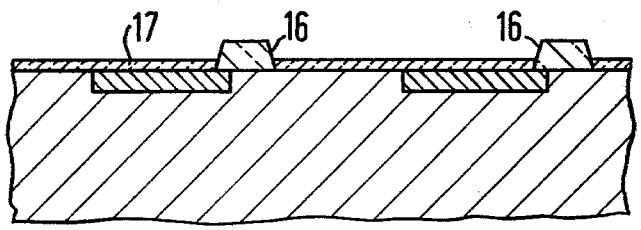
Figure 3C:
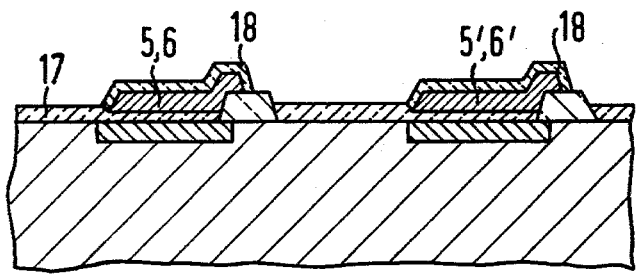
Figure 3D:
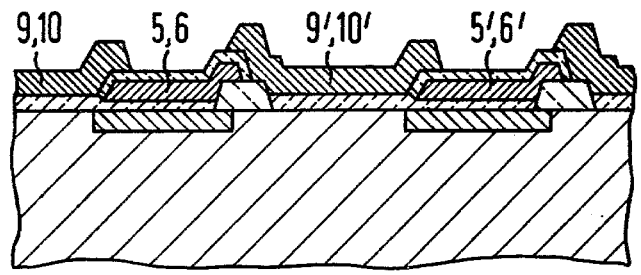

Now an expedient process for the production of the previously described storage elements will be explained making reference to FIG. 3 which has been based upon a doped semiconductor layer 1 consisting in particular of silicon which is coated all round with a thick insulating layer 1a, consisting for example, of $SiO_2$ FIG. 3a). The insulating layer 1a is provided with openings 15 through which, in a doping step, there are formed oppositely doped zones 2 which represent the bit line and—when the storage capacitor is designed with oppositely doped storage zones—also the zones 4. In FIG. 3 only the zones 4 of the individual storage elements can be seen corresponding to the sectional representation along the line II—II in FIG. 1. Following the coating of the doped zones 4 with an oxide layer and the simultaneous driving in of the doping atoms, the oxide openings 16 are then provided. The openings 16 each correspond to the zones of the individual transfer electrodes 10 and the zones of the adjoining storage electrodes 5. Then the openings 16 are coated with a thin insulating layer 17 (FIG. 3b). A first, electrically conductive coating is then applied to the entire surface and is then removed by masked etching steps until only those parts which represent the storage electrode 5, 5' of the individual storage elements and the associated reference potential lines 6, 6' remain. Then a further insulating layer 18 is applied by thermal oxidation. Now the exposed, thin insulating layer 17 grows somewhat (FIG. 3c). Then a second, electrically conductive coating is applied to the entire surface. The latter is then removed by masked etching steps until only those parts which form the transfer electrodes 10, 10' and the associated word lines 9, 9' of the storage elements remain (FIG. 3d). With this sequence of process steps, the lines 9, 9' overlap the lines 6, 6'. If, on the other hand, the parts 9, 10 and 9', 10' are formed from the first conductive coating and the parts 5, 6 and 5', 6' are formed from the second conductive coating, the lines 6, 6' overlap the lines 9, 9'. The storage elements are completed by the application of a protective layer which has not been shown here.

Although various minor modifications may be suggested by those versed in the art, it should be understood that we wish to embody within the scope of the patent warranted hereon, all such embodiments as reasonably and properly come within the scope of our contribution to the art.

We claim as our invention:

1. A semiconductor storage element system, comprising:
   (a) a plurality of storage elements, each storage element having a storage capacitor, a transfer gate, a word line, a bit line, and a reference potential line;
   (b) a doped semiconductor layer of first conductivity type having a storage zone for the storage capacitor in the semiconductor layer and at a surface thereof, a bit line zone of second conductivity type also being provided in the semiconductor layer at the surface thereof;
   (c) an insulating layer on the surface of the semiconductor layer with the word line and reference potential line arranged in strip-like fashion thereon;
   (d) a storage electrode of the storage capacitor arranged above the storage zone and being formed of a portion of the reference potential line which is separated by a thinner insulating layer from the semiconductor layer;
   (e) the transfer gate being positioned adjacent the storage electrode and being formed of a portion of the word line which is separated from the semiconductor layer by a thinner insulating layer;
   (f) said transfer gate comprising means for selectively conductively coupling the bit line zone to the storage capacitor storage zone when a given potential is applied to the transfer gate; and
   (g) the word line and reference potential line running parallel and being arranged directly adjacent to one another and at right angles to the bit line.

2. A storage element system as claimed in claim 1 in which the word line and the reference potential line overlap one another at their edges.

3. A storage element system as claimed in claim 1 in which the storage zone is formed by a doped surface-side semiconductor zone of second conductivity type.

4. A storage element system as claimed in claim 1 in which the storage zone comprises an inversion edge layer.

5. A storage element system as claimed in claim 1 wherein the plurality of storage elements are all provided on the same semiconductor layer, that a first group of the storage elements is assigned a common, surface-side strip-like semiconductor zone of second conductivity type as the bit line, word lines of a second group of storage elements being combined to form a common word line, and reference potential lines of the second group of storage elements being combined to form a common reference potential line.

6. A storage element system as claimed in claim 5 in which common reference potential lines of the second group of storage elements having means for selective disconnection from a reference potential to permit the reference potential lines following this disconnection to function as a common word line for a third group of storage elements.

7. A storage element system as claimed in claim 1 in which the strip-like word line comprises a highly doped semiconductor material formed of polycrystalline silicon.

8. A storage element system as claimed in claim 1 in which the strip-like reference potential line comprises a highly doped semiconductor material formed of polycrystalline silicon.

9. A method for the production of a storage element having a storage capacitor with a storage electrode transfer gate, word line, reference potential line, and bit line, comprising:
   (a) coating a doped semiconductor layer with an insulating layer;
   (b) providing openings in the insulating layer through which a surface side semiconductor zone of doping conductivity opposite to the semiconductor layer is formed in the semiconductor layer by doping;
   (c) again providing a closed insulating layer on the semiconductor layer and then providing an opening in the insulating layer which corresponds to a region of the transfer gate and of the capacitor storage electrode;
   (d) coating the semiconductor layer within this opening with a thin insulating layer and then applying a first, electrically conductive coating to an entire surface of the insulating layer and thin insulating layer;
   (e) removing by masked etching steps portions of the conductive coating until only parts which form the storage electrode and the reference potential line remain;
   (f) applying another insulating layer which covers the remaining parts of the first conductive coating and then applying a second electrically conductive coating to the entire surface of another insulating layer; and
   (g) removing portions of the second coating by masked etching steps until only parts thereof remain which form the transfer gate and the word line.

10. A method for the production of a storage element having a storage capacitor with a storage electrode transfer gate, word line, reference potential line, and but line, comprising the steps of:
   (a) coating a doped semiconductor layer with an insulating layer;
   (b) providing openings in the insulating layer through which a surface side semiconductor zone of doping conductivity opposite to the semiconductor layer is formed in the semiconductor layer by doping;
   (c) again providing a closed insulating layer on the semiconductor layer and then providing an opening in the insulating layer which corresponds to a region of the transfer gate and of the capacitor storage electrode;
   (d) coating the semiconductor layer within this opening with a thin insulating layer and then applying a first, electrically conductive coating to an entire surface of the insulating layer and thin insulating layer;
   (e) removing by masked etching steps portions of the conductive coating until only parts which form the transfer gate and the word line remain;
   (f) applying another insulating layer which covers the remaining parts of the first conductive coating and then applying a second electrically conductive coating to the entire surface of another insulating layer; and
   (g) removing portions of the second coating by masked etching steps until only parts thereof remain which form the storage electrode and the reference potential line.

11. A semiconductor storage element system comprising:

(a) a plurality of storage elements, bit lines, reference potential lines, and word lines, each storage element having a storage capacitor and transfer gate associated therewith;

(b) a doped semiconductor layer of first conductivity type having storage zones for the storage capacitor and strip-like bit line zones of second conductivity type in the semiconductor layer and at a surface thereof (c) an insulating layer on the surface of the semiconductor layer with word lines and reference potential lines running parallel with one another on the insulating layer and at right angles to the bit line zones, edge portions of the word lines overlapping and being insulated from edge portions of the reference potential lines;

(d) a storage electrode of the storage capacitor arranged above the storage zone and being formed of a portion of the reference potential line which is separated by a thin portion of the insulating layer from the semiconductor layer;

(e) the transfer gate being positioned alongside the storage electrode and being formed of a portion of the word line which is separated from the semiconductor layer by a thinner portion of the insulating layer; and (f) said transfer gate comprising means for selectively conductively coupling the bit line zone to the storage capacitor zone when a given potential is applied to the transfer gate.

* * * * *